(12) United States Patent
Tsuchida

(10) Patent No.: US 7,384,582 B2
(45) Date of Patent: *Jun. 10, 2008

(54) MOLD CLEANING SHEET AND METHOD FOR PRODUCING SEMICONDUCTOR DEVICES USING THE SAME

(75) Inventor: Kiyoshi Tsuchida, Yonezawa (JP)

(73) Assignees: Renesas Technology Corp., Tokyo (JP); Hitachi Yonezawa Electronics Co., Ltd., Yamagata (JP)

( * ) Notice: Subject to any disclaimer, the term of this patent is extended or adjusted under 35 U.S.C. 154(b) by 420 days.

This patent is subject to a terminal disclaimer.

(21) Appl. No.: 10/296,724

(22) PCT Filed: Jun. 28, 2001

(86) PCT No.: PCT/JP01/05547

§ 371 (c)(1),
(2), (4) Date: Nov. 26, 2002

(87) PCT Pub. No.: WO02/11966

PCT Pub. Date: Feb. 14, 2002

(65) Prior Publication Data

US 2003/0131428 A1    Jul. 17, 2003

(30) Foreign Application Priority Data

Aug. 4, 2000    (JP) .............................. 2000-236687

(51) Int. Cl.
   *B29C 45/14* (2006.01)

(52) U.S. Cl. ..................................... 264/39; 264/328.8
(58) Field of Classification Search .................. 264/39, 264/241, 271.1, 272.11, 272.14, 272.17
See application file for complete search history.

(56) References Cited

U.S. PATENT DOCUMENTS

| 5,124,383 A | * | 6/1992 | Obama et al. ............... 510/188 |
| 6,436,318 B1 | * | 8/2002 | McFarland et al. ........... 264/39 |
| 6,511,620 B1 | * | 1/2003 | Kawahara et al. ......... 264/40.5 |

FOREIGN PATENT DOCUMENTS

| JP | 1-95010 | | 4/1989 |
| JP | 03-202327 | | 9/1991 |
| JP | 3-202327 | | 9/1991 |
| JP | 4-173117 | | 6/1992 |
| JP | 6-254866 | | 9/1994 |
| JP | 8-132446 | | 5/1996 |
| JP | 409070856 A | * | 3/1997 |
| JP | 2001-62846 | | 3/2001 |

* cited by examiner

*Primary Examiner*—Monica A Huson
(74) *Attorney, Agent, or Firm*—Mattingly, Stanger, Malur & Brundidge, P.C.

(57) ABSTRACT

A cleaning sheet (29) is formed with a trough-hole (29a) at a portion corresponding to a cavity of a mold along with a slit (29b) or a flow cavity cut (29c) at every corner at an outer periphery of the through-hole (29a) and is placed between a first mold half and a second mold half of the mold to clean the inside of the mold, thereby improving the cleaning effect of the mold.

42 Claims, 12 Drawing Sheets

FIG. 3
(a)
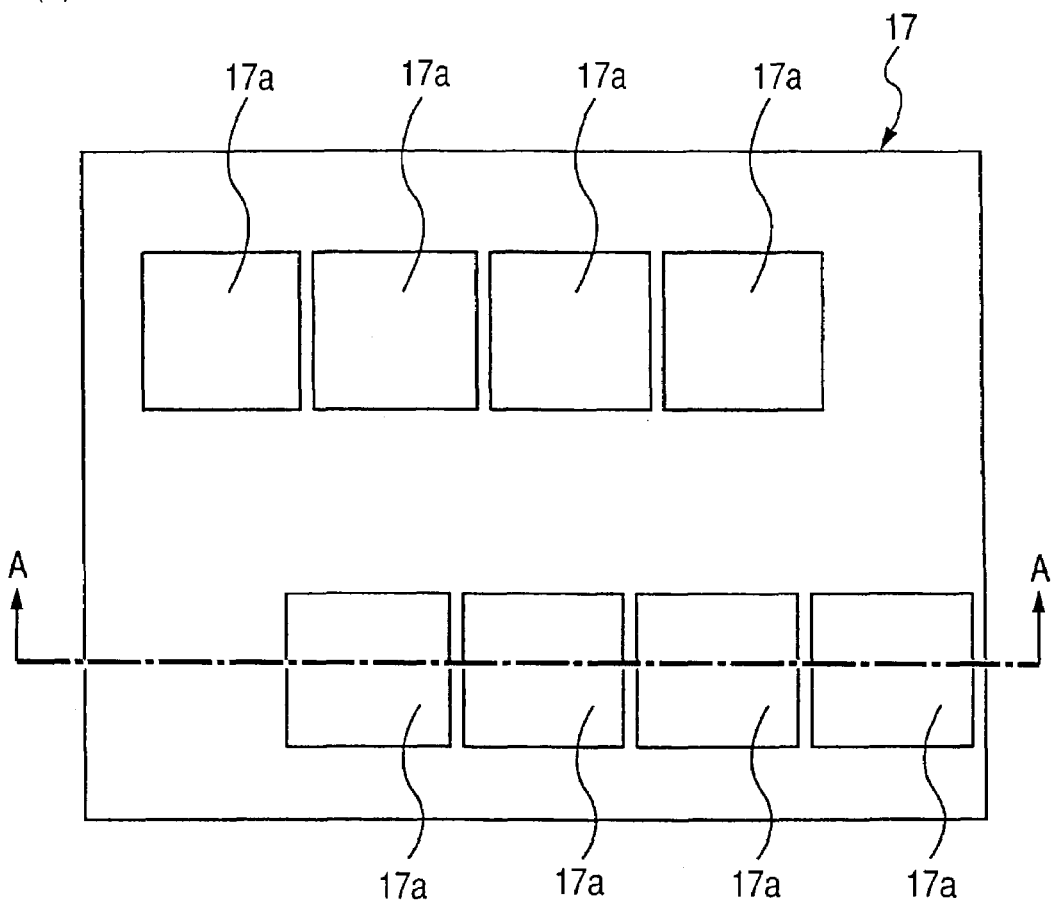
(b)
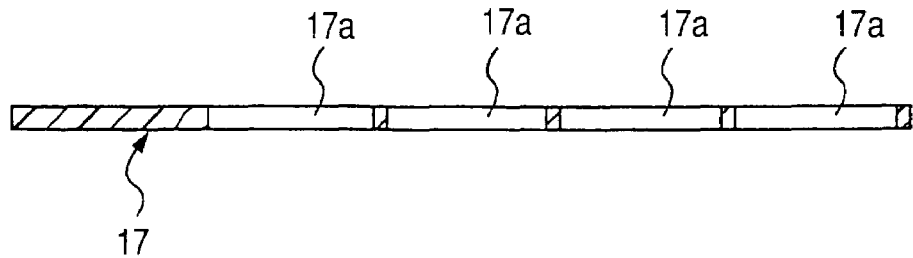

FIG. 10
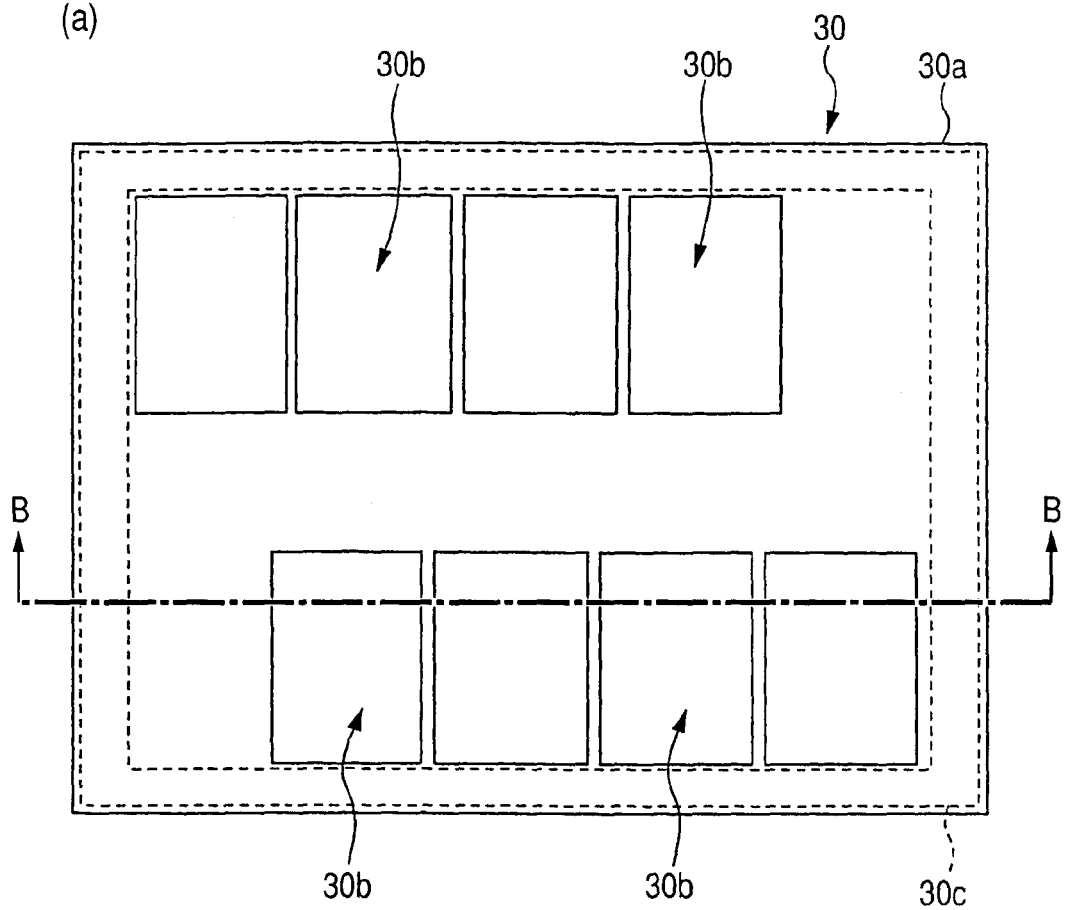
(a)
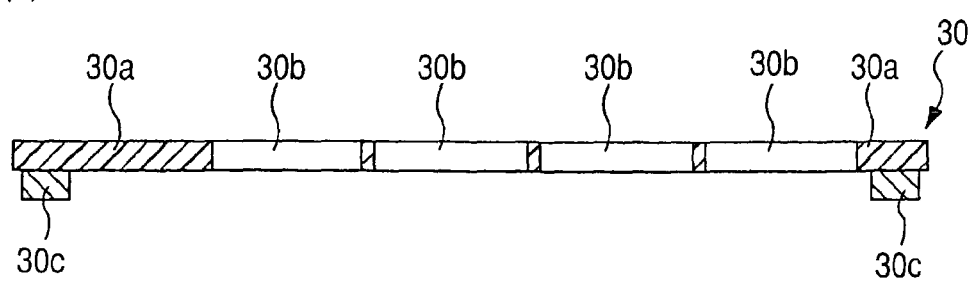
(b)

MOLD CLEANING SHEET AND METHOD FOR PRODUCING SEMICONDUCTOR DEVICES USING THE SAME

TECHNICAL FIELD

This invention relates to a semiconductor-producing technique, and more particularly, to a technique effective for application to an improvement in cleaning effect on the inside of a mold for a semiconductor device and also on productivity.

BACKGROUND ART

In the resin molding step for resin molded-type semiconductor devices, resin molding is repeated several times, so that resin burrs and dirt, such as oil or dust, are accumulated in the inside of the mold, in which a molding resin is filled, or in the cavities, runners and air vents of a pair of top and bottom halves constituting the mold and also in a cull block and its neighbor.

Such dirt adversely influences the quality of moldings and leads to a lowering of releasability when a product is removed from the mold. Accordingly, it is necessary for a worker to clean the mold at intervals of given shots.

However, the cleaning of a mold by a worker is a manual work, which requires much time. Thus, there is a demand for a technique wherein a mold can be cleaned within a short time.

For a technique meeting the requirement, a method has been carried out, as stated in Japanese Laid-open Patent Application No. Hei 1(1989)-95010, wherein a lead frame not mounting a semiconductor chip (hereinafter referred to as dummy lead frame) is clamped between the main surfaces (faces) of a mold, and a cleaning resin formed of a melamine resin or the like is charged into the mold and hardened to cause dirt to be deposited on the cleaning resin surface, thereby removing the dirt along with the cleaning resin.

Alternatively, there is known a method of directly pouring a cleaning resin into the cavity at a high pressure or normal pressure without use of any dummy lead frame or the like.

However, according to the first-mentioned technique, an expensive dummy lead frame has to be used for cleaning, and not only this is poor in economy, but also a dummy lead frame of a specific shape matched with a mold has to be set in position and clamped, so that precise positioning between the mold and the dummy lead frame becomes necessary. Moreover, with a molded resin for cleaning, the resin formed at cull and runner portions is separated out of the lead frame and the removal of this separated resin from the mold requires much time, thus being poor in working property. In addition, the separated cull and runner may be caught in a sliding portion of a molding apparatus, with the possibility of causing mechanical breakdown.

In order to solve such problems as stated hereinabove, a technique set out below has been proposed.

As described in Japanese Laid-open Patent Application No. Hei 6(1994)-254866, the technique comprises the steps of clamping a sheet-shaped cleaning member made of cotton cloth (non-woven fabric), in which a cleaning resin can be impregnated and permeated, between opened mold halves, and filling a cleaning resin in a molten state in the cavity of the closed mold.

As described in the known instance, when a cleaning resin in a fluid form is charged in such a state that the sheet, in which a cleaning resin and chemicals are able to be impregnated therein and permeated therethrough, is placed between the main surfaces (faces) of the top and bottom mold halves, an advantage is offered in that not only the positioning accuracy required between the mold and the sheet can be lowered, but also the cleaning resin and chemicals can be infiltrated at a portion where the sheet is sandwiched between the main surfaces of the top and bottom mold halves, thereby permitting the mold to be cleaned.

In the technique, however, when the cleaning resin is filled in the cavity, the sheet-shaped member is vertically moved (lifted) within the cavity. This causes a phenomenon wherein the sheet-shaped member becomes resistant to the flow of the cleaning resin, not allowing the cleaning resin to be run to all corners of the cavity.

Eventually, dirt is left at the corners of the cavity, with the attendant problem that cleaning within the cavity becomes unsatisfactory.

It should be noted that the faces of the mold have recesses, such as a flow cavity (capable of escaping air or a molding resin to prevent air from being entrained from a gate and ensure well-balanced filling of the molding resin in the cavity) and an air vent, in communication therewith formed at corners of the outer periphery of the cavity.

However, where the molding is subjected to cleaning with use of a cleaning sheet for a mold, the cleaning resin is unlikely to creep in the corners of the cavity and vicinities thereof. As a result, the cleaning resin does not enter into the flow cavity and air vent, and thus the flow cavity and air vent cannot be cleaned. This arises the problem of shortage of a molding resin being filled into the cavity upon molding of a product after cleaning.

Further, if the molding resin is unlikely to creep in the corners of the cavity and vicinities thereof, the cleaning resin is not stuck at portions of the molding cleaning sheet corresponding to the cavity corners and vicinities thereof. This presents the problem that after completion of the cleaning, when the cleaning resin is removed from the faces of the mold along with the mold cleaning sheet, the cleaning resin is partly left, which takes much time in removing the mold cleaning sheet and the cleaning resin from the faces.

In the faces of a mold for molding of SOP (small outline package) having an elongated portion to be molded and QFN (quad flat non-leaded package) using a matrix frame, where the distance between the outer edge of a cavity and the margin of the face is relatively small (e.g. where the distance is 10 mm or below), the cleaning resin leaked from the cavity runs out of the mold cleaning sheet upon cleaning of the mold and attaches to over the side surfaces contiguous to the faces of the mold.

In this case, it takes much time to remove the cleaning resin from the side surfaces of the mold, with the attendant problem that the efficiency of the cleaning work lowers.

An object of the invention is to provide a mold cleaning sheet which is able to improve the cleaning effect of a mold and also improve productivity through the reduction in time of a cleaning work and also a method of producing semiconductor devices using the mold cleaning sheet.

The above and other objects and novel features of the invention will become apparent from the description of the present specification and the attached drawings.

DISCLOSURE OF THE INVENTION

The invention provides a mold cleaning sheet which is placed between a pair of first mold half and a second mold half of a mold so as to clean the inside of the mold wherein when placed between the first mold half and the second mold half, the sheet entirely covers the faces of the mold therewith and has a through-hole formed correspondingly to a cavity of the mold.

The invention also provides a cleaning method, which comprises the steps of providing a mold cleaning sheet which entirely covers the faces of a mold made of a first mold half and a second mold half and has a through-hole formed correspondingly to a cavity of the mold, placing the mold cleaning sheet on the entire faces of the mold so that the through-hole is in conformity with the cavity and clamping the mold cleaning sheet between the first mold half and the second mold half, supplying a cleaning resin to the cavity, making the cleaning resin pass through the through-hole of the mold cleaning sheet to fill the cleaning resin in the cavity, and after solidifying the cleaning resin, releasing the cleaning resin and the mold cleaning sheet from the mold.

Furthermore, the invention provides a molding method of a semiconductor device, which comprises the steps of (a) providing first and second mold halves having a face and a recess formed in the face, respectively, (b) providing a sheet having a through-hole and capable of being impregnated and permeated with a cleaning resin, (c) clamping the sheet between the faces of the first and second mold halves so that the position of the through-hole of the sheet is conform with the recesses of the first and second mold halves, (d) after the step (c), pouring a cleaning resin in the recesses of the first and second mold halves, (e) after the step (d), removing the sheet and the cleaning resin from the first and second mold halves, (f) providing a semiconductor chip having a plurality of electrodes on a main surface thereof, a conductor member, and a plurality of wires electrically connecting the plurality of electrodes of the semiconductor chip and the conductor member therewith, (g) after the step (e), accommodating in position the semiconductor chip and the plurality of wires in the recesses of the first and second mold halves and sandwiching the conductor member between the faces of the first and second mold halves, and (h) after the step (g), pouring a molding resin in the recesses of the first and second mold halves so that the semiconductor chip, the plurality of wires and part of the conductor member are molded.

BRIEF DESCRIPTION OF THE DRAWINGS

FIG. 3(a) and FIG. 3(b) are views showing an instance of a mold cleaning sheet according to Embodiment 1 of the invention wherein FIG. 3(a) is a plan view, and FIG. 3(b) is a sectional view taken along the line A—A;

FIG. 10(a) and FIG. 10(b) are views showing an instance of a structure of a mold cleaning sheet according to Embodiment 3 of the invention wherein FIG. 10(a) is a plan view and FIG. 10(b) is a sectional view taken along the line B—B of FIG. 10(a);

BEST MODE FOR CARRYING OUT THE INVENTION

Figure 1:
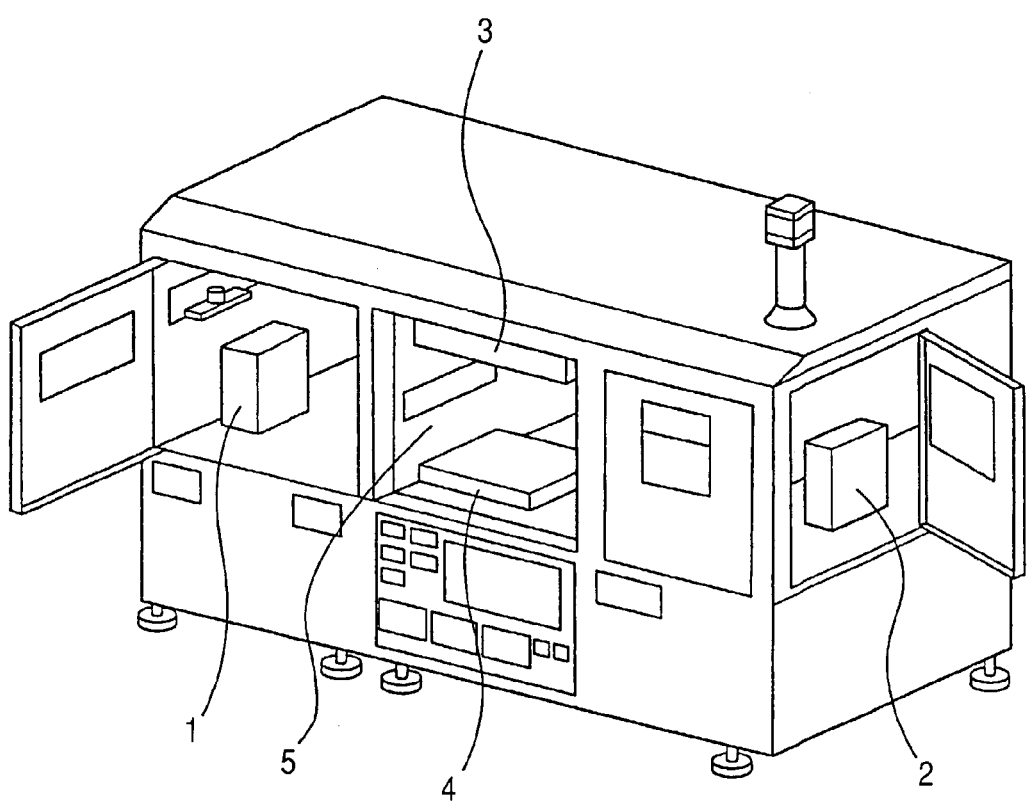
FIG. 1 is a perspective view showing an example of a structure of a transfer molding apparatus for carrying out molding by use of a molding cleaning sheet according to Embodiment 1 of the invention.

In the following embodiments, the same or similar parts or portions are not repeatedly illustrated in principle except as otherwise herein required.

Moreover, in the following embodiments, a plurality of sections or embodiments are separately described, if necessary, for convenience's sake. Unless otherwise specified, such sections or embodiments are not mutually irrelative, but one is in relation with variations, details and supplemental description of part or all of others.

In the following embodiments, where reference is made to the number and the like parameters of elements (including the number, value, amount, range and the like), it should not be construed to limit, for example, the number to a specified one, but a larger or smaller number may be usable except where specified and where it is necessary to limit to a specified number clearly in principle.

The embodiments of the invention are described in detail with reference to the accompanying drawings. It will be noted that throughout the drawings for illustrating the embodiments, like reference numerals indicate like members having same function and are not repeatedly explained.

Initially, Embodiment 1 of the invention is illustrated. A transfer molding apparatus shown in FIG. 1 is of a multi-pot type, which is used, for example, for molding a semiconductor chip 24 shown in FIG. 6 and inner leads 20 and the like electrically connected to the semiconductor chip 24.

This transfer molding apparatus includes a first mold half 3 serving as a top mold half and a second mold half 4 paired therewith and serving as a bottom mold half, a resin molding unit 5 having the first mold half 3 and the second mold half 4, a loader 1 transferring a work (which is herein a leaf frame obtained after completion of die bonding and wire bonding) to the resin molding unit 5, and an unloader 2 withdrawing the work from the resin molding unit 5. In the transfer molding apparatus, the lead frame bonded with the semiconductor chip 24 (see FIG. 6) is transferred from the loader 1, shown in FIG. 1, to the resin molding unit 5, in which the semiconductor chip 24 is resin molded. It will be noted that QFP (quad flat package) 19, which is a resin-molded semiconductor device after completion of resin molding, is transferred with the unloader 2 and accommodated therein.

Figure 2:
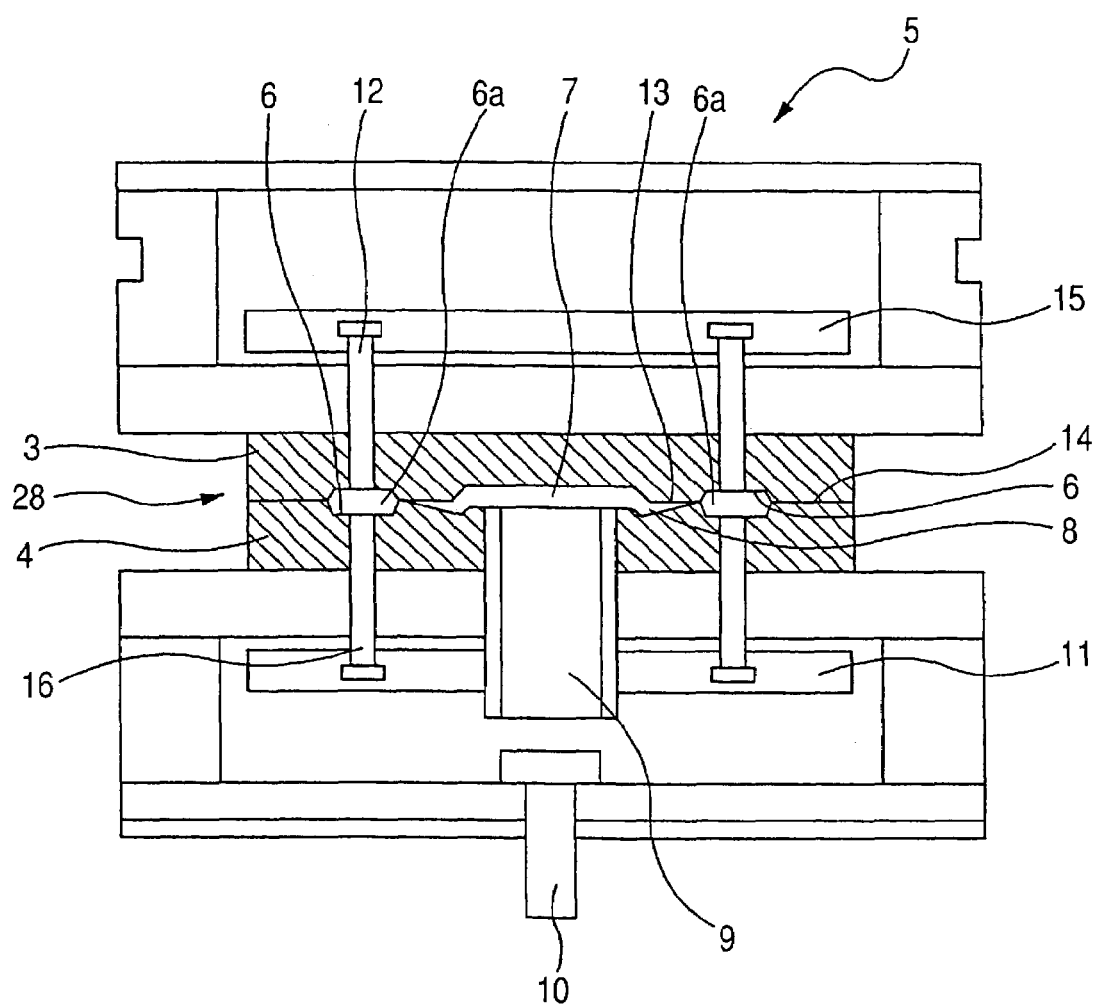
FIG. 2 is a view, partially in section, of a structure of a resin molding unit of the transfer molding apparatus shown in FIG. 1.
Figure 6:
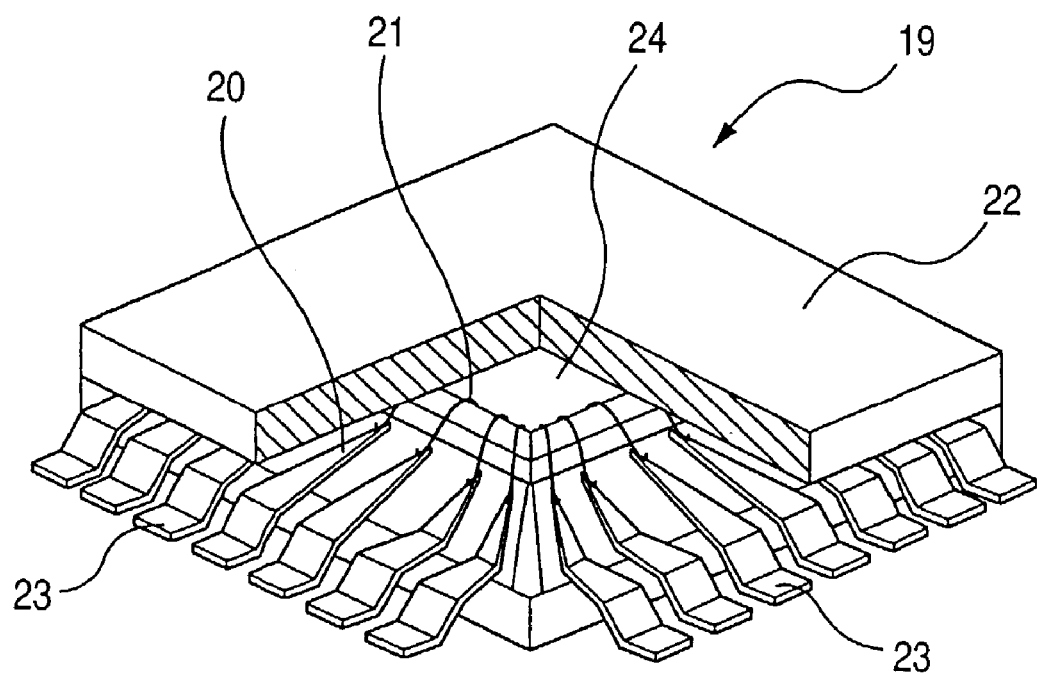
FIG. 6 is a perspective view, partially in section, of an instance of a structure of a semiconductor device produced according to a method of producing a semiconductor device according to the invention.

Further, the resin molding unit 5 shown in FIG. 2 is provided with a cavity 6 having a shape corresponding to a molded portion 22 of the QFR 19 shown in FIG. 6, a cull 7, a runner 8, a pot 9, a plunger 10, ejector plates 11, 15, ejector pins 12, 16, a gate 13, and an air vent 14.

Figure 4:
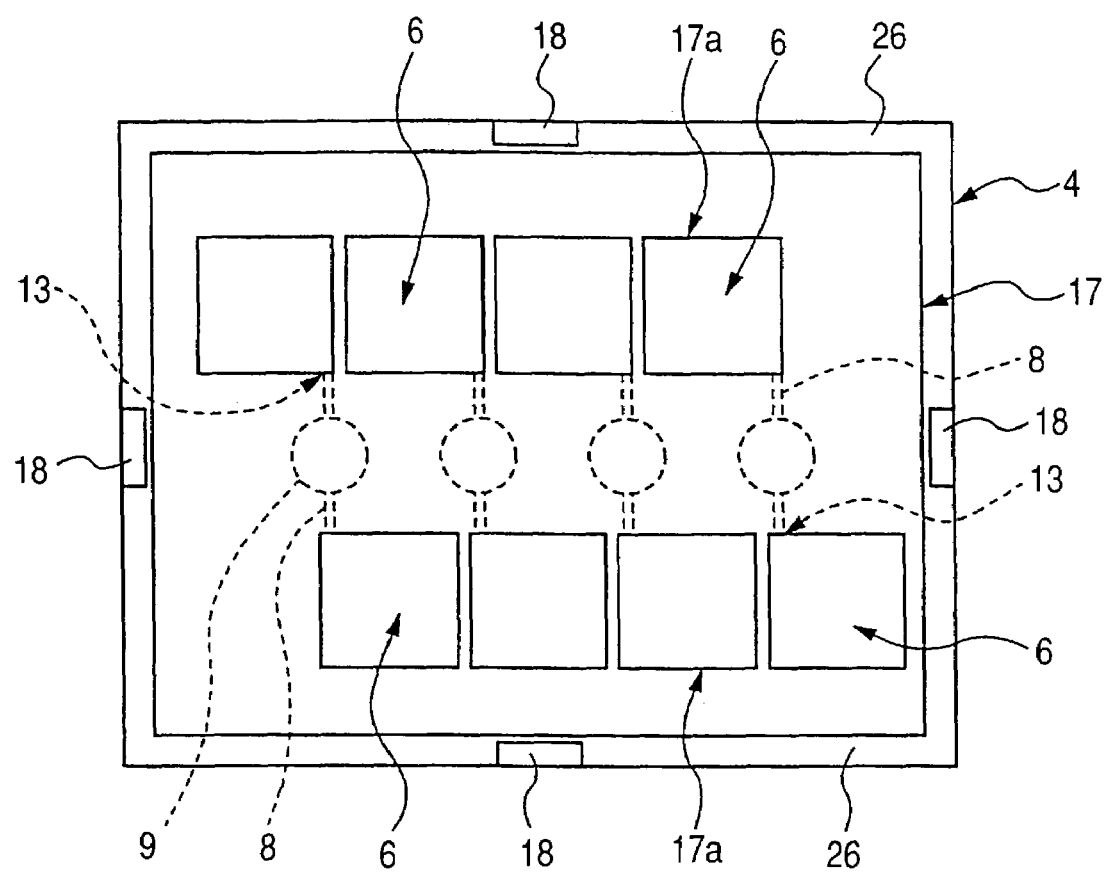
FIG. 4 is a plan view showing an instance of a state where a mold cleaning sheet is placed on the face of a second mold half of a mold provided at the resin molding unit shown in FIG. 2.

As shown in FIG. 4, a plurality of cavities with a given shape, in which the semiconductor chips 24 are disposed, respectively, are formed at a face of the second mold half 4 of a mold 28 (see FIG. 2) (it should be noted that the cavities 6 are formed at a face 26 of the first mold half 3, like the second mold half 4).

A plurality of cylindrical pots 9, wherein a molding resin in the form of tablets are set, are formed in position of the second mold half 4 therethrough, and the first mold half 3 has the culls 7, as shown in FIG. 2, at portions corresponding to the pots 9.

Moreover, a plurality of runners communicating with the plurality of cavities 6 are formed from the cull. In such a state that the first mold half 3 and the second mold half 4 are in intimate contact with each other, the pot 9 is closed with the cull 7 at the upper side thereof, and the pots 9 respectively, communicate with the plurality of cavities through the culls 7 and the runners 8. It will be noted that the air vent 14 for permitting air in the cavity to escape to outside and completely fill the resin therein is formed at the outside of the cavity 6.

Next, a mold cleaning sheet 17 (herein after referred to simply as cleaning sheet) of Embodiment 1 shown in FIGS. 3(*a*) and 3(*b*) is now described.

The cleaning sheet 17 is used for cleaning the inside of the mold 28 by placing the cleaning sheet 17 between the first mold half 3 and the second mold half 4 of the mold 28 when the semiconductor chip 24 does not undergo molding. When placed between the first mold half 3 and the second mold half 4, the cleaning sheet 17 entirely covers the faces (parting faces other than the cavity) of the mold 28 therewith and is formed with through-holes 17*a* corresponding to the cavities 6 of the mold 28.

It should be noted that the through-holes 17*a* formed in the cleaning sheet 17 of Embodiment 1 is formed substantially in the same shape as an opening 6*a* of the cavity 6 (see FIG. 2).

More particularly, the through-hole 17*a* is formed as having substantially the same shape and size as or a square pattern that is slightly smaller in size than the opening 6*a* of the first mold half 3 and the second mold half 4.

Figure 5:
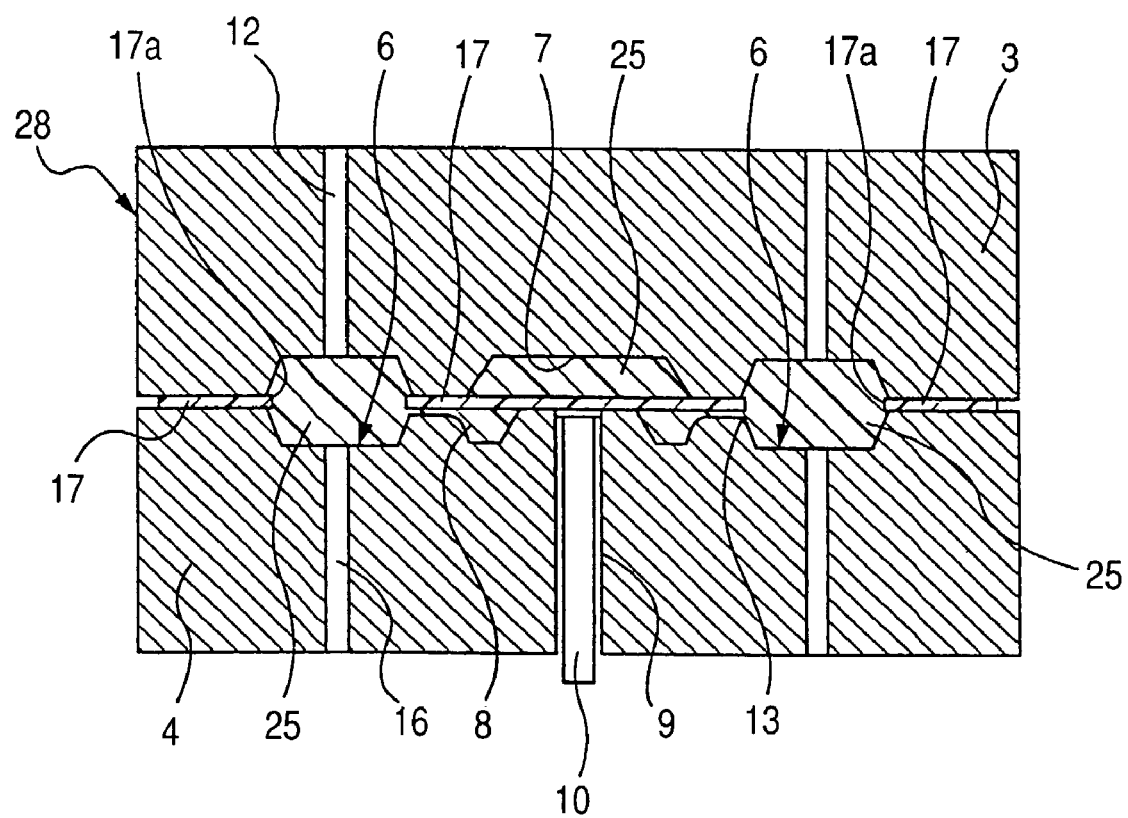
FIG. 5 is a view, partially in section, of an instance of a state in case where the mold is cleaned by use of the mold cleaning sheet shown in FIGS. 3(a) and 3(b)

In this condition, when cleaned, only the cleaning sheet 17 is clamped between the first mold half 3 and the second mold half 4, under which a cleaning resin 25 shown in FIG. 5 is supplied to the cavity 6. The cleaning resin 25 passes through the through-hole 17*a* of the cleaning sheet 17 within the cavity 6, so that the cleaning resin 25 is filled throughout the cavity 6 without lifting the cleaning sheet 17 through the resistance of the cleaning resin 25 within the cavity 6.

Accordingly, the inside or inner surfaces of the cavity 6 can be satisfactorily cleaned.

The cleaning sheet 17 of Embodiment 1 has such a size and shape as to entirely cover the face 26 of the second mold half 4 (which is true of the first mold half 3) as shown in FIG. 4.

More particularly, the cleaning sheet 17 is so formed as to have a size sufficient to be guided with positioning wedges 18 which are provided at the respective sides of the outer periphery of the face 20 of the second mold half 4 and are used for positioning of the top and bottom mold halves. In this state, for mounting of the cleaning sheet 17 on the face 26 of the second mold half 4, the cleaning sheet 17 should be mounted in conformity with the positioning wedges 18 at the respective sides, and it is unnecessary to make high precision positioning with the mold 28.

The cleaning sheet 17 of Embodiment 1 is formed, for example, of 100% paper, cloth or a nonwoven fabric having a heat resistance and flexibility, of which it is preferred to form the sheet with a nonwoven fabric.

The thickness of the cleaning sheet 17 is, for example, at about 0.6 mm when the sheet is clamped between the first mold half 3 and the second mold half 4.

The QFP 19 shown in FIG. 6 is an instance of a semiconductor device set up after molding with the transfer molding apparatus shown in FIG. 1. This device includes bonding wires 21 for electrical connection between electrodes of a semiconductor chip 24 and corresponding inner leads 20, and the molded portion 22 formed by resin molding of the semiconductor chip 24, the inner leads 20 and the bonding wires 21, and a plurality of outer leads 23 extended from individual inner leads 20 and serving as external terminals projecting from the molded portion 22 to outside. The respective outer leads 23 are formed in a gull wing shape.

Next, a method of producing a semiconductor device of Embodiment 1 is now described.

It is to be noted here that the method of producing the semiconductor device comprises the steps of molding (resin molding) the semiconductor chip 24 by use of the transfer molding apparatus shown in FIG. 1, and cleaning the inside of the mold 28 of the transfer molding apparatus using the cleaning sheet 17 shown in FIGS. 3(*a*) and 3(*b*).

Initially, in the wire bonding step, the semiconductor chip 24 and the inner leads 20 of the lead frame, which is a work, are electrically connected by means of the bonding wires 21.

Thereafter, in the molding step, the semiconductor chip 24 and the inner leads 20 electrically connected with the semiconductor chip 24 are resin-molded with a molding resin along with the bonding wires 21.

The resin molding step in the molding step of Embodiment 1 is illustrated.

First, a solid molding resin (tablets) heated by means of a preheater is set on the plunger 10 shown in FIG. 2, and the lead frame wherein the semiconductor chip 24 and the inner leads 20 are wire-bonded is transferred from the loader 1 shown in FIG. 1 to the resin molding unit 5.

In this state, the second mold half 4 is moved closely toward the first mold half 3, thereby forming a space, including the cavity 6, between the first mold half 3 and the second mold half 4 of the mold 28. Thereafter, a molten molding resin is forced into the cull 7 by means of the plunger 10, with the result that the molding resin flows into the cavity 6 through the runner 8 and the gate 13.

Further, the molding resin filled in the cavity is heated and cured and is thus thermally hardened, followed by downward movement of the second mold half for mold opening.

Subsequently, while the ejector plate 15 is downwardly moved, the ejector plate 11 is upwardly moved. This permits the ejector pins 12, 16 to be projected to complete the mold opening, and the resin-molded QFP (semiconductor device) 19 is removed. This resin molding is repeated several hundreds of shots per day, so that the inside of the mold 28 filling the molding resin, i.e. the faces of the first mold half 3 and the second mold half 4 of the mold 28 (including the air vent 14, the cavity 6, the runner 8, the cull 7 and surrounding areas thereof) is accumulated with resin burrs or dirt (deposits) such as oil or dust.

In order to remove the dirt, the mold 28 in the molding step should be subjected to the cleaning step.

It will be noted that the QFP 19 is subjected to a cutting step to cut the lead frame, thereby completing the setup of the QFP 19 shown in FIG. 6.

Next, the cleaning step (the cleaning procedure of a mold) of Embodiment 1 is set forth.

A cleaning sheet 17 shown in FIGS. 3(a) and 3(b) is provided, which is formed of a nonwoven fabric and which entirely covers the face 26 of the mold 28 and is formed with a through-hole 17a corresponding to the cavity 6 of the mold 28.

Subsequently, the temperature of the mold 28 is set, for example, at 170° C. to 180° C.

Thereafter, as shown in FIG. 4, the cleaning sheet 17 is disposed entirely over the face 26 so that the through-hole 17a is set in conformity with the cavity 6, under which the second mold half 4 is moved closely toward the first mold half 3.

The close movement permits the cleaning sheet 17 to be clamped between the first mold half 3 and the second mold half 4, and the cleaning resin 25 is subsequently supplied into the cavity 6.

As shown in FIG. 5, the cleaning resin 25 is made to pass through the through-hole 17a of the cleaning sheet 17 and filled in the cavity 6 to every corner thereof.

Subsequently, the cleaning resin 25 is hardened, followed by downward movement of the second mold half 4 to release the first mold half 3 and the second mold half 4 for the release of the mold.

Furthermore, the ejector plate 15 is downwardly moved and the ejector plate 11 is upwardly moved. This permits the ejector pins 12, 16 to be projected thereby completing the mold release.

The cleaning resin 25 and the cleaning sheet 17 are released from the mold 28.

More particularly, the cleaning sheet 17 and the cleaning resin 25 resin-molded on the sheet are removed.

In this way, the mold 28 is cleaned in the inside thereof.

It will be noted that for molding again after cleaning of the mold 28 in the inside thereof by use of the cleaning sheet 17 shown in FIGS. 3(a) and 3(b), a semiconductor chip 24 is set in the cavity 6 of the mold 28, followed by supplying a molding resin in the cavity 6 in the same manner as in the above-stated molding method to resin mold this semiconductor chip 24.

When using the mold cleaning sheet of Embodiment 1 and the method of producing a semiconductor device by use of the sheet, the following features and effects are obtained.

More particularly, since the through-hole 17a corresponding to the cavity 6 is formed in the cleaning sheet 17, the cleaning resin 25 can pass through the through-hole 17a of the cleaning sheet 17 upon supply and charge of the cleaning resin 25 to the cavity 6. In this condition, the flow of the cleaning resin 25 within the cavity is not impeded irrespective of the existence of a filler contained in the cleaning resin 25 and the resin charging pressure, thereby permitting the cleaning resin 25 to be distributed to all corners.

As a result, the cleaning resin 25 distributed to all corners of the cavity 6 can remove the dirt in the corner of the cavity 6.

In this way, the cavity 6 of the mold 28 can be satisfactorily cleaned, thereby improving the cleaning effect.

Because the cleaning sheet 17 entirely covers the faces 26 of the mold 28 upon cleaning, the cleaning resins 25 in the cavity 6, the faces 26 (parting faces), the cull 7 and the gate 13 are combined together through the cleaning sheet 17, so that when the cleaning sheet 17 is removed after curing of the cleaning resin 25, the resin can be withdrawn integrally without separation into pieces on the cleaning sheet 17.

Accordingly, the cleaning sheet 17 can be readily attached to or detached from the mold 28. This allows the cleaning sheet 17 after cleaning to be handled simply.

Eventually, the time of the cleaning work using the cleaning sheet 17 can be shortened.

Because the cleaning sheet 17 entirely covers the faces 26 of the mold 28, the dirt at the inlet of the pot 9 of the mold 28, the area around the cull 7, air vent 14 and the like can be removed with the cleaning resin 25 sticking to the cleaning sheet 17. In addition, resin burrs can also be removed, thereby reducing the working time appreciably.

Further, because the cleaning sheet 17 entirely covers the faces 26 of the mold 28, it is possible to clean portions which are not in contact with the cleaning resin 25 in the mold 28.

Irrespective of the number of the lead frames set in the mold 28, the faces 26 of the mold 28 can be entirely covered with one cleaning sheet, highly precise positioning of the cleaning sheet 17 relative to the mold 28 is not necessary.

In this connection, when a cleaning sheet 17 made of a nonwoven fabric is used in Embodiment 1, it is not necessary to machine the mold 28 to make positioning pins and positioning pin holes as conventionally required in the case using a dummy lead frame.

This leads to the reduction in cost of the mold 28.

Since any dummy lead frame is not used, the mismatch ascribed to the shift of the dummy lead frame de not occur.

Since the faces 26 of the mold 28 are entirely covered with one cleaning sheet 1, only one cleaning sheet 17 is set in position irrespective of the number of lead frames set within the mold upon molding. Thus, the cleaning work is performed at low costs.

By using the cleaning sheet 17 of Embodiment 1, since the expensive dummy lead frame is not used, the cleaning work in the mold 28 is performed at low cost.

Because the cleaning sheet 17 has the through-hole 17a corresponding to the opening 6a of the cavity 6 and entirely covers the faces 26 of the mold 28 upon cleaning, the cleaning effect can be improved without lowering the workability of cleaning.

It will be noted that in the procedure of producing a semiconductor device such as QFP19 of Embodiment 1, the cleaning work of the mold 28 can be reduced appreciably, thereby improving the cleaning effect of the mold 28 and the productivity of the semiconductor device.

Next, Embodiment 2 of the invention is described.

In Embodiment 2, a variation of the mold cleaning sheet used in the cleaning step of the mold shown in FIG. 2 is described.

Figure 7:
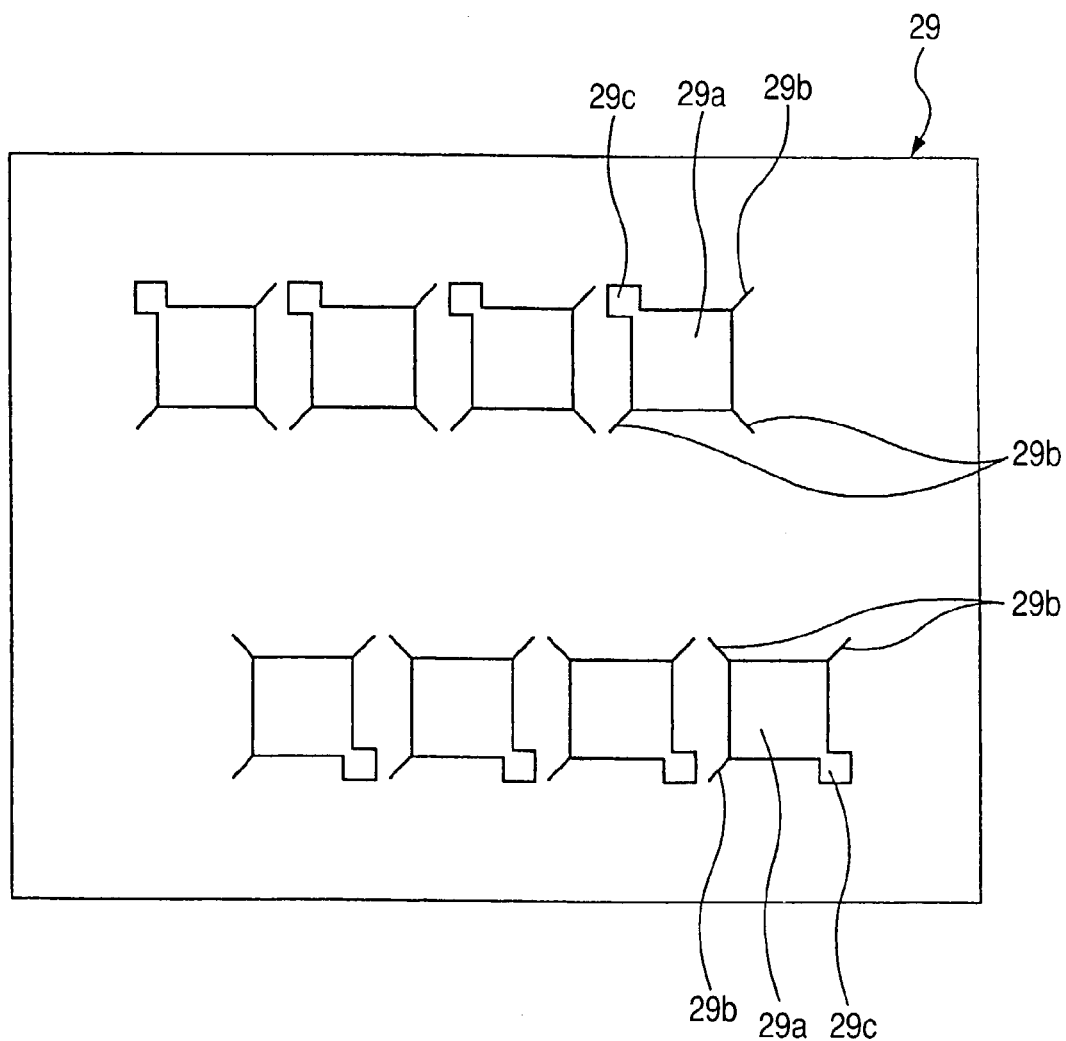
FIG. 7 is a plan view showing an instance of a structure of a mold cleaning sheet according to Embodiment 2 of the invention.

A cleaning sheet (mold cleaning sheet) 29 shown in FIG. 7 is formed with through-holes 29a corresponding to the cavities 6 of the mold 28 and also with a slit 29b at the corners of a periphery of each through-hole 29a and a cut such as a flow cavity cut 29c.

The through-hole 29a has a size substantially equal to or slightly smaller than the cavity 6 of the mold 28.

The slits 29b and the flow cavity cut 29c are, respectively, formed at portions corresponding to the flow cavities (recesses) communicating with the cavities 6 of the second mold half 4, of which the flow cavity cuts 29c are ones formed substantially in the same shape as the flow cavity 27.

The flow cavity 27 permits air or the molding resin within the cavity 6 to be escaped, so that air entrainment from the gate 13 is prevented and the molding resin in the cavity is filled in a well-balanced condition.

Accordingly, when the mold 28 is cleaned, the slits 29b and the flow cavity cut 29c are provided for ensuring satisfactory filling of the cleaning resin 25, shown in FIG. 5, relative to the flow cavities 27 and the air vents 14 which are recessed portions communicating to the cavities 6.

More particularly, when the cleaning resin 25 is poured into the cavity 6, the cleaning resin 25 is filled in the cavity 6 through the through-hole 29a of the cleaning sheet 29. At the corners of the cavity 6, the cleaning resin 25 flows into the flow cavities 27 and the air vents 14 through the flow cavity cut 29c and the slits 29b.

In this way, the cleaning resin 25 can cling to the cleaning sheet 29 via the flow cavity cut 29c and the slits 29b, and thus cleaning resin 25 can be filled in the flow cavities 27 and the air vents 14.

As a consequence, the cleaning resin 25 after hardening thereof can be removed from the second mold half 4 while removing the cleaning sheet 29 from the mold 28.

It will be noted that as to whichever the slit 29b is formed as a cut or the flow cavity cut 29c is formed, the cleaning resin 25 is relatively unlikely to flow into the flow cavity 27 that is located at a position distant from the gate 13 of the second mold half 4, and thus the flow cavity cut 29c, not the slit 29b, should be favorably formed.

Since the cleaning resin 25 is relatively likely to flow into the flow cavity 27 at the side of the gate 13 the slit 29b is formed in this case.

Figure 8:
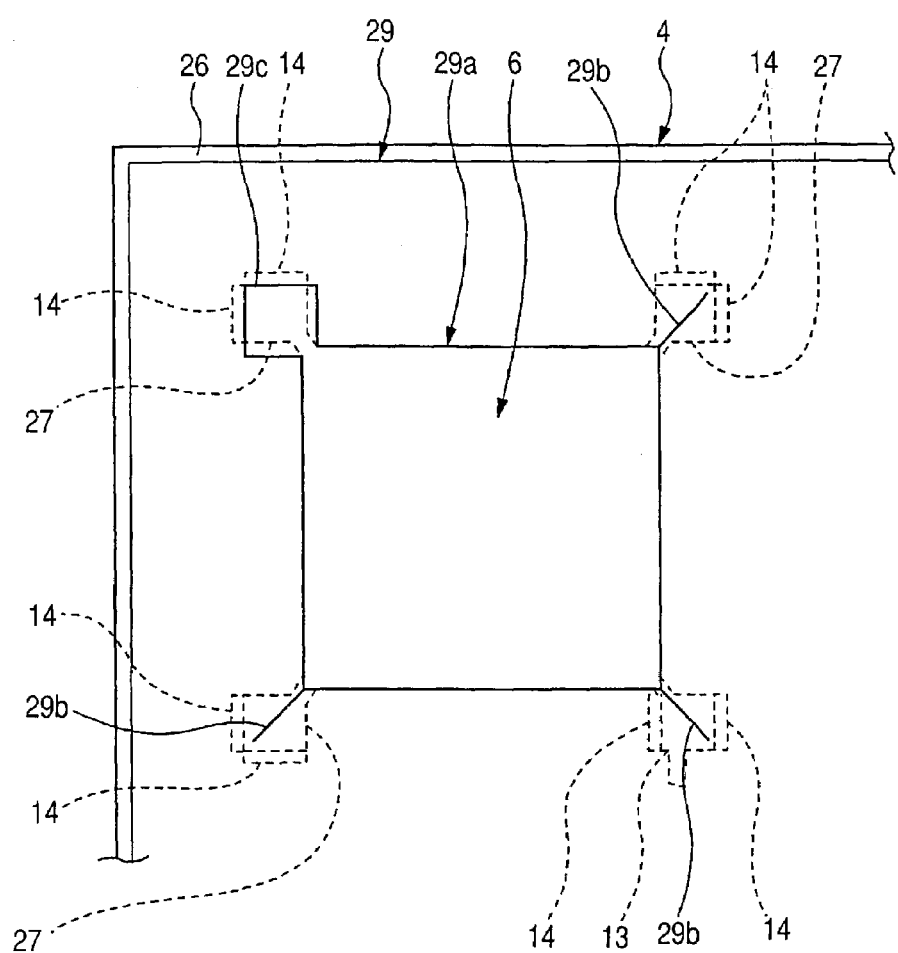
FIG. 8 is a partially enlarged, plan view showing an instance of a state where the mold cleaning sheet shown in FIG. 7 is placed in a face of a mold.

Thus, with the variation shown in FIGS. 7 and 8 (i.e. the cleaning sheet 29 for QFP 19 shown in FIG. 6), only the flow cavity 27 located most remotely from the gate 13 is constituted as the flow cavity cut 29c, and the slit 29b is formed at the other three corners.

Figure 9:
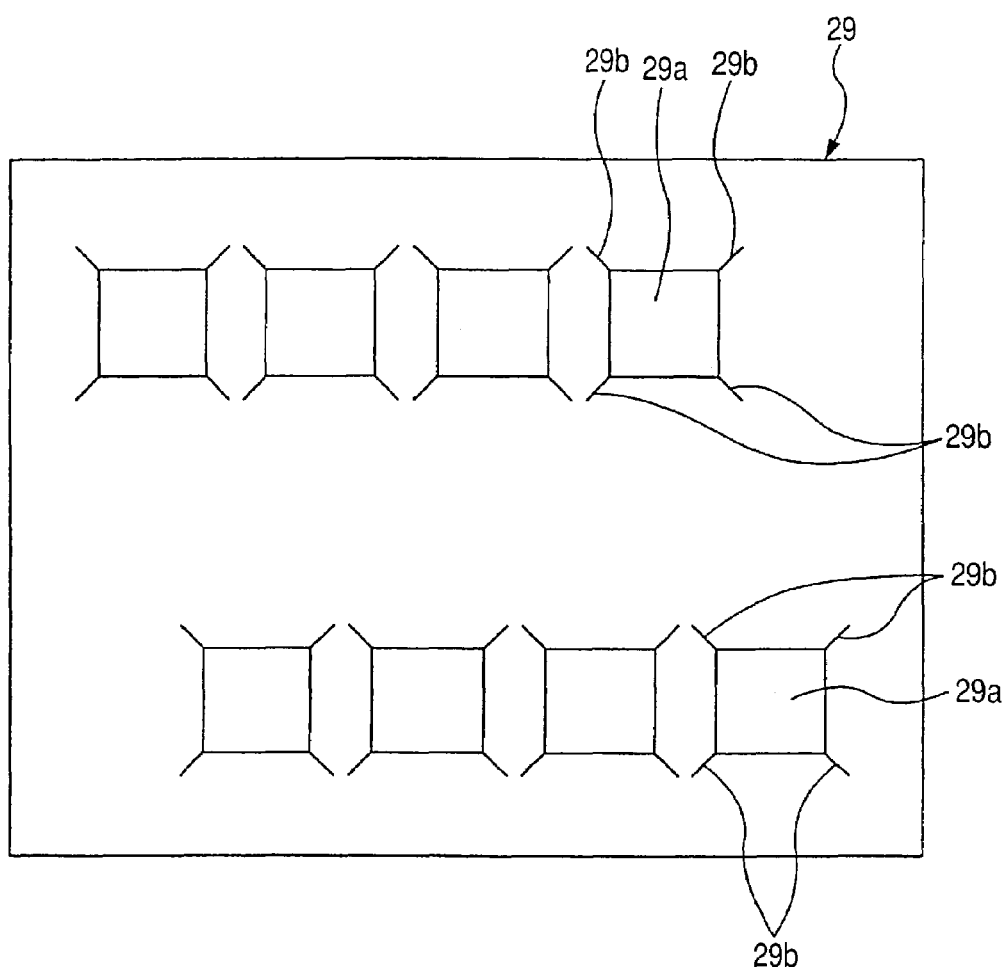
FIG. 9 is a plan view showing a structure of a mold cleaning sheet that is a variation of the mold cleaning sheet shown in FIG. 7.

In contrast thereto, another variation shown in FIG. 9 (i.e. a cleaning sheet 29 for QFP 19 shown in FIG. 6) shows the case where the slit 29b is formed at four corners. As will be apparent from this, it is not critical to form the flow cavity cut 29c (see FIG. 7) and the slits 29b at whichever corners. Likewise, the width and length of the slit 29b or the shape of the flow cavity cut 29c is not critical.

It will be noted that the type of material for and the thickness of the cleaning sheet 29 of Embodiment 2 are similar to the cleaning sheet 17 of the foregoing Embodiment 1.

Other structures of the cleaning sheet 29 of Embodiment 2 and the method of producing a semiconductor device using the cleaning sheet 29 are, respectively, similar to those of Embodiment 1 including the method of producing a semiconductor device using the cleaning sheet 17 illustrated in Embodiment 1, and are not repeatedly set forth herein.

According to the cleaning sheet 29 of Embodiment 2 and the method of producing a semiconductor device using the same, when the cleaning resin 25 is charged into the cavity 6 when cleaning the mold 28 shown in FIG. 2, the cleaning resin 25 can be made to pass to the slits 29b and the flow cavity cut 29c of the cleaning sheet 29.

This permits the cleaning resin 25 to be filled in the recesses such as the flow cavities 27 and the air vents 14 upon cleaning, and the cleaning resin 25 can be stuck and attached to the cleaning sheet 29 through the cuts.

Accordingly, after hardening of the cleaning resin 25, the release of the cleaning sheet 29 from the second mold half 4 causes the cleaning resin 25 being filled in the recesses (the flow cavities 27 and the air vents 14) at the face of the second mold half to be removed. Thus, the cleaning effect of the recesses can be improved and the cleaning resin 25 ca be reliably removed along with the cleaning sheet 29, resulting in the easy removal of the cleaning resin 25 from the recesses.

This entails the reduction in cleaning time of the mold using the cleaning sheet 29.

It is to be noted that when the cuts such as the flow cavity cut 29c and the slid 29b, which correspond to the recesses at portions (portions relatively remove from the gate 13) opposite to the gates 13 of the second mold half 4, are shaped in conformity with the recesses, the cleaning effect of the recesses can be further improved.

Next, Embodiment 3 of the invention is now described.

In Embodiment 3, a variation of a mold cleaning sheet used in the cleaning step of the mold 28, shown in FIG. 2, in the production of the semiconductor device illustrated in Embodiment 1 is described, like Embodiment 2.

More particularly, a framed cleaning sheet (molding cleaning sheet) 30 shown in FIGS. 10(a) and 10(b) includes, like the cleaning sheet 17 illustrated in the foregoing Embodiment 1, a cleaning sheet 30a which entirely covers the face 26 of the mold 28 and has through-holes 30b at portions corresponding to the cavities 6, and a framed reinforcing sheet 30c which is positioned along a marginal portion 26a of the face 26 at the outside of a plurality of cavities 6 in the face 26 of the mold.

It will be noted that the through-holes 30b formed in the cleaning sheet 30a have a size substantially equal to or slightly larger than that of the cavity 6 of the mold 28.

Figure 12:
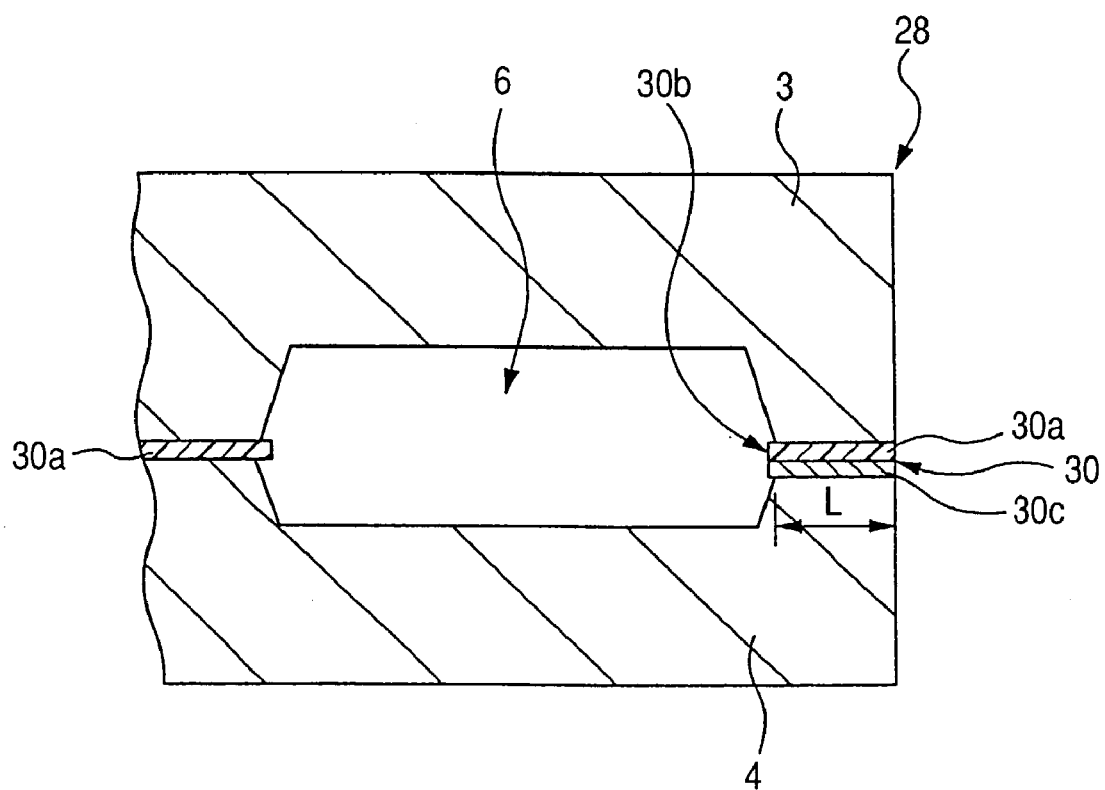
FIG. 12 is a partially enlarged, sectional view taken along the line C—C of FIG. 11.

When the cleaning resin 25 (see FIG. 5) is charged upon cleaning of the mold 28 as shown in FIG. 12, the framed cleaning sheet 30 of Embodiment 3 increases a clamping force at the outside of the cavities 6 upon clamping of the mold 28 of the second mold half serving as a low mold half and the first mold half serving as a top mold half so that the cleaning resin 25 is prevented from leakage from the faces 26 of the mold 28.

Figure 11:
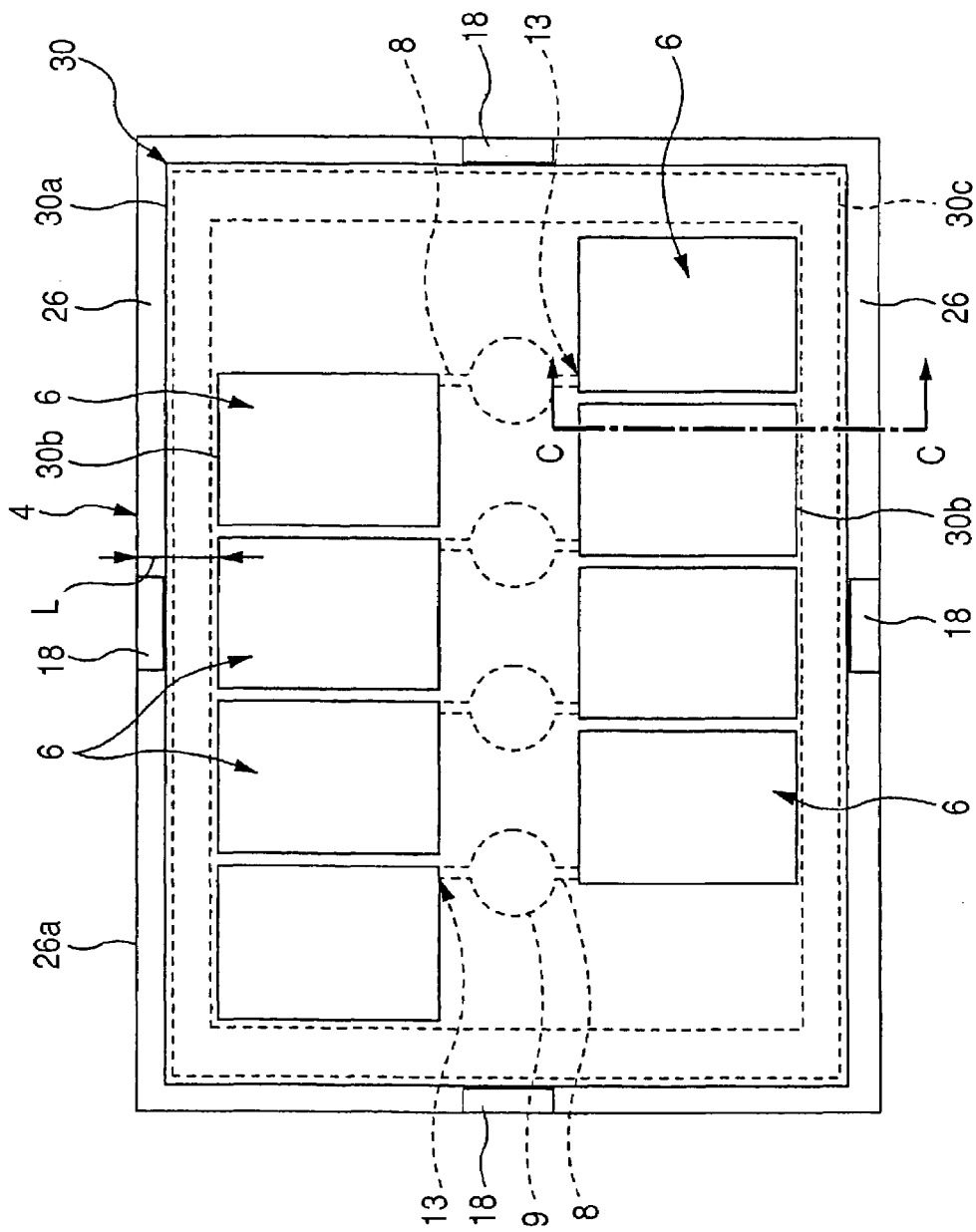
FIG. 11 is a plan view showing an instance of a state where the mold cleaning sheet shown in FIGS. 10(a) and 10(b) is placed on a face of a mold.

More particularly, as shown in FIGS. 10(a) and 10(b), the framed cleaning sheet 30 includes a cleaning sheet 30a having through-holes 30b corresponding to the cavities 6 shown in FIG. 11 formed therein, and a framed reinforcing sheet 30c which can be arranged along the marginal portion 26a of the face 26 at the outside of each of a plurality of cavities 6 in the face 26 of the second mold half 4, both sheets being bonded together.

When the mold 28 is cleaned, the cleaning sheet 30a is so arranged entirely over the face 26 that the through-holes 30b of the cleaning sheet 30a are set in conformity with the cavities 6, and the framed reinforcing sheet 30c is arranged on the face 26 along the marginal portion 26a of the face 26 at the outside of the plural cavities 6 of the framed reinforcing sheet 30c.

It will be noted that the framed cleaning sheet 30 of Embodiment 3 is one wherein the cleaning sheet 30a and the reinforcing sheet 30c have been preliminarily bonded together as shown in FIGS. 10(a) and 10(b), so that when used for cleaning, the framed cleaning sheet 30 is placed on the face 26 of the second mold half 4.

Thereafter, as shown in FIG. 12, the cleaning sheet 30a and the reinforcing sheet 30c are clamped between the first mold half 3 and the second mold half 4, after which the cleaning resin 25 is poured into the cavities 6 under clamped conditions to fill the cleaning resin 25 in the cavities. After hardening of the cleaning resin 25, the cleaning resin 25 is removed from the faces 26 of the mold 28 along with the cleaning sheet 30a to clean the mold 28.

It will be noted that upon molding of a semiconductor device, such as SOP having a relatively elongated, molded portion 22 (see FIG. 6 although the QFP 19 shown in FIG. 6 has the molded portion 22 that is substantially square) or QFN having a matrix frame, if the faces 26 of the mold 28 are so arranged that the distance (L in FIGS. 11 and 12) between the outer edge of the cavity 6 and the marginal portion 26a of the face 26 is relatively smaller (e.g. if L is 10 mm or below), the cleaning resin leaked from the cavity 6 upon cleaning of the mold 28 runs out of the mold cleaning sheet and may attach to over side surfaces contiguous to the faces 26 of the mold 28. In this sense, the framed cleaning sheet 30 shown in FIGS. 10(a) and 10(b) is more effective when used for cleaning the mold 28 for SOP or QFN wherein the above-indicated L is 10 mm or below.

The framed reinforcing sheet 30c has, for example a thickness of about 0.1 to 0.2 mm and should be preferably formed of a nonwoven fabric, paper, copper or a fluorine resin.

Moreover, like the framed cleaning sheet 30 of Embodiment 3, the cleaning sheet 30a and the reinforcing sheet 30c may be preliminarily bonded together. Alternatively, both may not be bonded together and may be separately provided, after which upon cleaning, the sheets are successively placed on the face 26 of the mold 28, followed by molding for cleaning.

The framed cleaning sheet 30 of Embodiment 3 is effective for application to a semiconductor device other than SOP or QFN but using a matrix frame or also to BGA using a tape substrate.

It is to be noted that the type of material and thickness of the cleaning sheet 30a of the framed cleaning sheet 30 of Embodiment 3 are same as those of the cleaning sheet 17 of Embodiment 1.

Further, the method of producing a semiconductor device using the framed cleaning sheet of Embodiment 3 is not repeatedly described herein because the method is substantially same as the method of producing a semiconductor device using the cleaning sheet 17 illustrated in Embodiment 1.

According to the framed cleaning sheet 30 of Embodiment 3 and the method of producing a semiconductor device using the same, when the mold 28 is cleaned, each through-hole 30b of the cleaning sheet 30a of the cleaning sheet 30 is arranged over the face 26 correspondingly to each cavity 6 and the reinforcing sheet 30c is disposed at the face 26 along the marginal portion 26a of the face 26 at the outside of plural cavities 6. In this condition, the framed cleaning sheet 30 is clamped between the first mold half 3 and the second mold half 4 of the mold 28 for cleaning, and thus the clamping force of the mold 28 can be increased. As a result, the leakage of the cleaning resin 25 from the faces 26 of the mold 28 can be prevented upon cleaning.

Accordingly, the cleaning resin 25 is prevented from attaching to the sides of the mold 28, thus saving the trouble of removing the resin. As a result, the cleaning work efficiency of the mold 28 ca be improved.

The use of the framed cleaning sheet 30 attached with the reinforcing sheet 30c prevents the cleaning resin 25 from leaking from the faces 26 of the mold 28 upon cleaning. Accordingly, the cleaning resin 25 can be well filled in the recesses such as the cavity 6 and the flow cavity cuts 29c (see FIG. 8). This leads to an improved cleaning effect of the recesses such as the cavity 6, the flow cavity cuts 29c and the like.

Especially, when the distance between the outer edge of the cavity in the mold 28 and the marginal portion 26a of the face 26 is relatively small (e.g. where the distance L shown in FIG. 11 is 10 mm or below), the framed cleaning sheet 30 having the reinforcing sheet 30c is most effective.

The use of the framed cleaning sheet 30 having the reinforcing sheet 30c can appropriately prevent leakage of the cleaning resin 25 from the faces 26 of the mold 28 upon cleaning and thus ensures attachment and detachment of the framed cleaning sheet 30 relative to the faces 26 of the mold 28.

Further, where the cleaning sheet 30a is made of a nonwoven fabric, the expansion and contraction of the cleaning sheet 30a can be prevented due to the use of reinforcing sheet 30c. This eventually leads to a further improvement in the cleaning work efficiency of the mold 28.

The invention made by the present inventors has been particularly described based on the embodiments of the invention, which should not be construed as limiting the invention thereto, and many modifications may be possible without departing from the spirit of the invention.

For instance, in the foregoing Embodiments 1, 2, 3, the case where the cleaning sheets 17, 29, 30a are, respectively, formed of a nonwoven fabric, the material for the cleaning sheets 17, 29, 30a is not limited to a nonwoven fabric and may include paper, other type of cloth and the like.

The thickness of the cleaning sheets 17, 29, 30a is not limited to that illustrated in the foregoing Embodiments 1, 2, 3 and those sheets having different thicknesses may also be used.

Moreover, with respect to the size of the cleaning sheets 17, 29, 30a, the sheets may be slightly smaller than the face 26 provided that the size is sufficient to cover substantially all of the face 26 of the mold 28.

As for the through-holes 17a, 29a, 30b formed in the cleaning sheets 17, 29, 30a, respectively, the shape and the number of the holes are not limited to those of the foregoing Embodiments 1, 2, 3, and various forms and different numbers of though-holes may be used. The through-hole may be substantially equal in size to the opening 6a of the cavity 6 or may be larger or smaller than the opening 6a of the cavity 6 provided that the cleaning resin 25 is able to pass therethrough.

It will be noted that the mold 28 of the foregoing Embodiments 1, 2, 3 may have multiple lead frames arranged in line or may have a matrix frame. In either case, the cleaning work can be performed at low costs.

In the foregoing Embodiments 1, 2, the case where the semiconductor device molded by means of the transfer molding apparatus shown in FIG. 1 is QFP 19 shown in FIG. 6 has been set forth, and the semiconductor device is not limited to the QFP 19. For instance, other types of semiconductor devices such as SPO may be used so far as they are molded with the transfer molding apparatus.

Further, although the mold 28 of the foregoing Embodiments 1, 2, 3 has been illustrated such that the first mold half 3 is a top mold half and the second mold half 4 is a bottom mold half, the first mold half 3 may be provided as a bottom mold half and the second mold half 4 provided as a top mold half.

INDUSTRIAL UTILITY

As stated hereinabove, the mold cleaning sheet of the invention and the method of producing a semiconductor device using the sheet can improve the cleaning effect of a mold and are suited for improving the productivity of a semiconductor device.

The invention claimed is:

1. A method of manufacturing a semiconductor device comprising the steps of:
 (a) providing a first mold having a main surface and having a first concaved portion provided thereon, and a second mold having a main surface and having a second concaved portion provided thereon;

(b) providing a resin containing plural particles;

(c) providing a sheet made of a material that can be impregnated and permeated by the resin, and having a through hole forming a shape which is substantially identical to a shape of the second concaved portion of the second mold;

(d) opposing and contacting the main surface of the first mold and the main surface of the second mold to each other, and disposing the sheet between the main surface of the first mold and the main surface of the second mold to position the through hole so as to be aligned with the second concaved portion;

(e) after the step (d), injecting the resin to an inside of the first concaved portion;

(f) after the step (e), removing the sheet on the main surface of the first mold and the second mold and the resin;

(g) after the step (f), opposing and contacting the main surface of the first mold and the main surface of the second mold to each other, and disposing a semiconductor chip to the inside of the first concaved portion; and (h) after the step (g), filling an encapsulating resin to the inside of the first concaved portion thereby encapsulating the semiconductor chip, wherein the sheet has a slit;

wherein the slit is formed in a part corresponding to an air vent of the first mold; and wherein in the step of (e), flowing the resin into the air vent through the slit.

2. A method of manufacturing a semiconductor device according to claim 1, wherein the sheet is a non-woven fabric, paper or net-like material.

3. A method of manufacturing a semiconductor device according to claim 1, wherein the sheet is formed with plural openings over an entire surface of the sheet, each opening having a diameter larger than that of the particles of the resin.

4. A method of manufacturing a semiconductor device according to claim 1, wherein the second mold has a second concaved portion on the main surface and the step (e) comprises a step of disposing a resin containing the plural particles to the inside of the second concaved portion and a step of applying heat and pressure to the resin and charging the same to the inside of the openings.

5. A method of manufacturing a semiconductor device according to claim 1, wherein the particles are formed of silica.

6. A method of manufacturing a semiconductor device according to claim 1, wherein the resin portion is a melamine resin.

7. A method of manufacturing a semiconductor device according to claim 1, wherein the method further comprises, before the step (d), the step of:

(i) opposing and contacting the main surface of the first mold and the main surface of the second mold and disposing a semiconductor chip to an inside of the opening surrounded with the main surface of the first mold and the first concaved portion; and (j) after the step (i), filling an encapsulating resin to the inside of the opening surrounded with the main surface of the first mold and the first concaved portion and encapsulating the semiconductor chip.

8. A method of manufacturing a semiconductor device comprising the steps of:

(a) providing a mold having an upper mold and a lower mold opposing to the upper mold, the upper and lower molds each having a concaved portion defining a cavity for molding a semiconductor chip;

(b) providing a cleaning sheet for the mold, the cleaning sheet having a through hole, the through hole having a rectangular shape generally corresponding to a shape of the cavity in a plan view;

(c) setting the cleaning sheet on the mold such that the cleaning sheet is disposed between the upper and lower molds and the through hole of the cleaning sheet is disposed at the cavity;

(d) clamping the cleaning sheet between the upper and lower molds;

(e) injecting a cleaning resin for the mold in the cavity such that a portion of the cleaning resin is bonded to a portion of the cleaning sheet;

(f) after the step (e), removing the cleaning sheet with the cleaning resin from the mold;

(g) after the step (f), disposing a lead frame with the semiconductor chip at the mold such that the semiconductor chip is disposed in the cavity; and (h) after the step (g), injecting an encapsulating resin in the cavity, to seal the semiconductor chip.

9. A method of manufacturing a semiconductor device according to claim 8, wherein in the step (e) is performed by injecting the cleaning resin including plural particles.

10. A method of manufacturing a semiconductor device according to claim 8, wherein in the step (e), the cleaning resin is bonded by impregnating a portion of the cleaning resin into the portion of cleaning sheet.

11. A method of manufacturing a semiconductor device according to claim 10, wherein the cleaning resin is hardened before the step (f).

12. A method of manufacturing a semiconductor device according to claim 8, wherein the lower mold has a pot portions and a gate portion;

wherein in the step (c), the cleaning resin is set in the pot portions; and wherein in the step (e), the cleaning resin is injected in the cavity through the gate portions.

13. A method of manufacturing a semiconductor device according to claim 8, wherein the steps from (b) to (f) are performed again after the steps from (g) to (h) are performed several times.

14. A method of manufacturing a semiconductor device according to claim 8, wherein the upper and lower molds each have a parting surface opposing to each other;

wherein in the step (d), the cleaning sheet is clamped with the parting surface of the upper and lower molds.

15. A method of manufacturing a semiconductor device according to claim 8, wherein the through hole has a square shape.

16. A method of manufacturing a semiconductor device comprising the steps of:

(a) providing a mold having an upper mold and a lower mold opposing to the upper mold, the upper and lower molds each having a first concaved portion defining a cavity for molding a semiconductor chip, and having a second concaved portion defining an air vent for removing an air in the cavity;

(b) providing a cleaning sheet for the mold, the cleaning sheet having a through hole and a slit, the through hole having a rectangular shape;

(c) setting the cleaning sheet on the mold such that the cleaning sheet is disposed between the upper and lower molds and the through hole of the cleaning sheet is disposed at the cavity and the slit of the cleaning sheet is disposed at the air vent, wherein one side of the through hole is positioned along one side of the cavity;

(d) clamping the cleaning sheet by the upper and lower molds;

(e) injecting a cleaning resin for the mold in the cavity such that a portion of the cleaning resin is bonded to a portion of the cleaning sheet;

(f) after the step (e), removing the cleaning sheet with the cleaning resin from the mold;

(g) after the step (f), disposing a lead frame with the semiconductor chip at the mold such that the semiconductor chip is disposed in the cavity; and (h) after the step (g), injecting an encapsulating resin in the cavity, to seal the semiconductor chip.

17. A method of manufacturing a semiconductor device according to claim 16, wherein the step (e) is performed by injecting the cleaning resin including plural particles.

18. A method of manufacturing a semiconductor device according to claim 16, wherein in the step (e), the cleaning resin is bonded by impregnating a portion of the cleaning resin into the portion of cleaning sheet.

19. A method of manufacturing a semiconductor device according to claim 18, wherein the cleaning resin is hardened before the step (f).

20. A method of manufacturing a semiconductor device according to claim 16, wherein the lower mold has a pot portions and a gate portion;

wherein in the step (c), the cleaning resin is set in the pot portions; and wherein in the step (e), the cleaning resin is injected in the cavity through the gate portions.

21. A method of manufacturing a semiconductor device according to claim 16, wherein the steps from (b) to (f) are performed again after the steps from (g) to (h) are performed several times.

22. A method of manufacturing a semiconductor device according to claim 16, wherein the upper and lower molds each has a third concaved portion defining a flow cavity for ensuring the well-balanced filling of the encapsulating resin;

wherein in the step (c), the cleaning sheet is set on the mold such that the slit of the cleaning sheet is disposed at the flow cavity.

23. A method of manufacturing a semiconductor device according to claim 16, wherein the upper and lower molds each have a parting surface opposing to each other;

wherein in the step (d), the cleaning sheet is clamped with the parting surface of the upper and lower molds.

24. A method of manufacturing a semiconductor device according to claim 16, wherein the through hole has a square shape.

25. A method of manufacturing a semiconductor device comprising the steps of:

(a) providing a mold having an upper mold and a lower mold opposing to the upper mold, the upper and lower molds each having a concaved portion defining a cavity for molding a semiconductor chip;

(b) providing a cleaning sheet for the mold, the cleaning sheet having a through hole, the through hole having a rectangular shape and having sides generally parallel to corresponding sides of the cavity in a plan view;

(c) setting the cleaning sheet on the mold such that the cleaning sheet is disposed between the upper and lower molds and the through hole of the cleaning sheet is disposed at the cavity;

(d) clamping the cleaning sheet between the upper and lower molds;

(e) injecting a cleaning resin for the mold in the cavity such that a portion of the cleaning resin is bonded to a portion of the cleaning sheet;

(f) after the step (e), removing the cleaning sheet with the cleaning resin from the mold;

(g) after the step (f), disposing a lead frame with the semiconductor chip at the mold such that the semiconductor chip is disposed in the cavity; and (h) after the step (g), injecting an encapsulating resin in the cavity, to seal the semiconductor chip.

26. A method of manufacturing a semiconductor device according to claim 25, wherein the step (e) is performed by injecting the cleaning resin including plural particles.

27. A method of manufacturing a semiconductor device according to claim 25, wherein in the step (e), the cleaning resin is bonded by impregnating a portion of the cleaning resin into the portion of cleaning sheet.

28. A method of manufacturing a semiconductor device according to claim 27, wherein the cleaning resin is hardened before the step (f).

29. A method of manufacturing a semiconductor device according to claim 25, wherein the lower mold has a pot portions and a gate portion;

wherein in the step (c), the cleaning resin is set in the pot portions; and wherein in the step (e), the cleaning resin is injected in the cavity through the gate portions.

30. A method of manufacturing a semiconductor device according to claim 25, wherein the steps from (b) to (f) are performed again after the steps from (g) to (h) are performed several times.

31. A method of manufacturing a semiconductor device according to claim 25, wherein the upper and lower molds each has a third concaved portion defining a flow cavity for ensuring the well-balanced filling of the encapsulating resin;

wherein in the step (c), the cleaning sheet is set on the mold such that the slit of the cleaning sheet is disposed at the flow cavity.

32. A method of manufacturing a semiconductor device according to claim 25, wherein the upper and lower molds each have a parting surface opposing to each other;

wherein in the step (d), the cleaning sheet is clamped with the parting surface of the upper and lower molds.

33. A method of manufacturing a semiconductor device according to claim 25, wherein the through hole has a square shape.

34. A method of manufacturing a semiconductor device comprising the steps of:

(a) providing a mold having an upper mold and a lower mold opposing to the upper mold, the upper and lower molds each having concaved portions defining cavities for molding a semiconductor chip;

(b) providing a cleaning sheet for the mold, the cleaning sheet having a plurality of through holes, wherein each through hole has a rectangular shape;

(c) setting the cleaning sheet on the mold such that the cleaning sheet is disposed between the upper and lower molds and the plurality of through holes of the cleaning sheet are disposed at corresponding cavities, wherein a single through hole of the cleaning sheet is positioned at each cavity;

(d) clamping the cleaning sheet by the upper and lower molds;

(e) injecting a cleaning resin for the mold in the cavity such that a portion of the cleaning resin is bonded to a portion of the cleaning sheet;

(f) after the step (e), removing the cleaning sheet with the cleaning resin from the mold;

(g) after the step (f), disposing a lead frame with the semiconductor chip at the mold such that the semiconductor chip is disposed in the cavity; and (h) after the step (g), injecting an encapsulating resin in the cavity, to seal the semiconductor chip.

35. A method of manufacturing a semiconductor device according to claim 34, wherein the step (e) is performed by injecting the cleaning resin including plural particles.

36. A method of manufacturing a semiconductor device according to claim 34, wherein in the step (e), the cleaning resin is bonded by impregnating a portion of the cleaning resin into the portion of cleaning sheet.

37. A method of manufacturing a semiconductor device according to claim 36, wherein the cleaning resin is hardened before the step (f).

38. A method of manufacturing a semiconductor device according to claim 34, wherein the lower mold has a pot portions and a gate portion;

wherein in the step (c), the cleaning resin is set in the pot portions; and wherein in the step (e), the cleaning resin is injected in the cavity through the gate portions.

39. A method of manufacturing a semiconductor device according to claim 34, wherein the steps from (b) to (f) are performed again after the steps from (g) to (h) are performed several times.

40. A method of manufacturing a semiconductor device according to claim 34, wherein the upper and lower molds each has a third concaved portion defining a flow cavity for ensuring the well-balanced filling of the encapsulating resin;

wherein in the step (c), the cleaning sheet is set on the mold such that the slit of the cleaning sheet is disposed at the flow cavity.

41. A method of manufacturing a semiconductor device according to claim 34, wherein the upper and lower molds each have a parting surface opposing to each other;

wherein in the step (d), the cleaning sheet is clamped with the parting surface of the upper and lower molds.

42. A method of manufacturing a semiconductor device according to claim 34, wherein the through hole has a square shape.

* * * * *